US012086567B1

(12) United States Patent
Fabian

(10) Patent No.: US 12,086,567 B1
(45) Date of Patent: Sep. 10, 2024

(54) COMPUTATION SYSTEM USING A SPHERICAL ARRANGEMENT OF GATES

(71) Applicant: Jesse Forrest Fabian, Seattle, WA (US)

(72) Inventor: Jesse Forrest Fabian, Seattle, WA (US)

( * ) Notice: Subject to any disclaimer, the term of this patent is extended or adjusted under 35 U.S.C. 154(b) by 271 days.

(21) Appl. No.: 17/693,432

(22) Filed: Mar. 14, 2022

Related U.S. Application Data

(60) Provisional application No. 63/160,817, filed on Mar. 14, 2021.

(51) Int. Cl.
*G06F 7/38* (2006.01)
*G06F 30/337* (2020.01)

(52) U.S. Cl.
CPC .............. *G06F 7/38* (2013.01); *G06F 30/337* (2020.01)

(58) Field of Classification Search
CPC .......... G06F 30/22; G06F 30/27; G06F 30/30; G06F 30/32; G06F 30/337; G06F 7/38; H03K 19/02; G06N 3/063
See application file for complete search history.

(56) References Cited

U.S. PATENT DOCUMENTS 5,504,839 A * 4/1996 Mobus .................. G06N 3/04
706/41
5,553,196 A * 9/1996 Takatori .................. G06T 7/00
706/31

(Continued)

*Primary Examiner* — Jason M Crawford

(57) ABSTRACT

A natural result of the different quantities of inputs and outputs in computational elements such as logic gates is a triangular shape when embedded in a material. The duplication of this shape while reducing empty space produces a curved structure, which taken to its ultimate expression is spherical. The inputs of the gates create a surface which is larger than the surface created by the outputs. In its spherical expression the input surface is the outside surface of the sphere, while the output is an inside surface of this sphere. Computation occurs as entropy transport from the outside surface, through layers, to an inside surface.

Current digital logic designs are often composed of two-input, one output designs. Several logic functions including NAND, NOR, AND, OR, XNOR, XOR are characterized by multiple inputs and one output. Other types of computational functions such as those of neurons and artificial neurons also may take multiple inputs and fewer or singular outputs. Of these types of computation methods, the quantity of inputs is larger than the quantity of outputs.

Implementation of logic gates in silicon by creating electronic transistors is constrained by the production process, by the material qualities of silicon, and by the shape of the input-output structure. Implementation of types of logic gates which operate on an optical basis, or chemical, momentum, entropy or other method, may vary in their material constraints but the constraints posed by input and output node size remain.

It can then be posed that a fundamental constraint in the design of physical computation architectures is the quantity of inputs and outputs, and their structure.

A design for a Computation System Using a Spherical Arrangement of Gates is submitted in this disclosure. For a logic gate structure which has a quantity of inputs, and an output, it is specified that the inputs are of the same physical size, and this size is to be the minimum possible size for the material and structure in which the gate is embodied.

It is specified that the output is of the same size as an inputs in this design, and this size is the minimum possible using the chosen materials of construction.

The quantity of inputs is higher than the quantity of outputs, while the size of each input is equal, and the size of an individual input is equal to the size of an output. A design which features two inputs is specified, the size of the inputs is approximately twice as large as the output. The following relationship is specified for a two-input, one output gate: the (Continued)

Concentric circles of gates.

input surface area is twice that of the output surface area. Let this relationship be the assumption upon which we base subsequent disclosure.

For our logic gate, the inputs require more surface area than the output. We can label the gate G1 and its inputs as i1 and i2, and the output as o1. If we position i1 and i2 as closely as possible, they will require twice the surface area that o1 requires. If we position together the inputs of a gate in a physically proximal sequence G1$i$1, G1$i$2 for gate 1, input 1 and input 2 are physically as close as possible. An individual gate results which is a triangular shape.

If we position together the inputs of several gates in a sequence G1$i$1, G1$i$2 G2$i$1, G2$i$2 G3Gi1, G3$i$2 the inputs for the three gates 1 2 and 3 are all physically as close as possible. The physical surface area required is 3 gates multiplied by 2 inputs=6 surface area units. If we position together the outputs of these gates in a sequence G1$o$1 G2$o$2 G3$o$3 the outputs of the three gates 1 2 and 3 require (3 gates each having 1 output) a total of 3 surface area units. The input surface is larger than the output surface.

A sequence of gates gathered as closely as possible in space forms a shape which is longer on one side (the input side) than it is on the other (the output side).

If the pattern is continued, a circle is formed. Concentric circles of gates are to be arranged, with the output of gates on the outer circles being near the input of gates on the inner circles.

By linking the output of a gate to the input(s) of other gates, logic can be performed by chains of gates, by selectively controlling the energy transmitted through individual links that span between outputs and inputs we can modify the logic process to produce different final outputs from initial inputs as desired. In the terminology of artificial neural networks, we can call the links weighted, and the logic gate can function as an artificial neuron's transfer function, and so the gate may behave as an artificial neuron.

We can implement the concentric rings of gates in the transverse dimension to obtain concentric spheres, while leaving a passage open through the sphere so that final outputs at the center can be accessed from outside.

The complete design is so disclosed, having a multitude of inputs which occupy the outside surface of a sphere, inside of which concentric spherical layers of gates are connected by weighted links, with the center of the sphere containing the final outputs of the logical process carried out by chains of gates arranged in concentric spheres. The total number of concentric spheres may vary as a computation process requires and constrained by material requirements.

1 Claim, 4 Drawing Sheets

(56) References Cited

U.S. PATENT DOCUMENTS

| | | | | |
|---|---|---|---|---|
| 9,646,243 | B1* | 5/2017 | Gokmen | G06N 3/08 |
| 10,452,989 | B2* | 10/2019 | Majumdar | G06N 10/00 |
| 10,733,166 | B1* | 8/2020 | Pratt | G06F 16/26 |
| 11,106,972 | B1* | 8/2021 | Verheyen | G06F 7/5443 |
| 11,216,250 | B2* | 1/2022 | Malaya | H03K 19/17728 |
| 2004/0153426 | A1* | 8/2004 | Nugent | G06N 3/063 706/26 |
| 2010/0220895 | A1* | 9/2010 | Koren | G01V 1/34 382/109 |
| 2014/0026107 | A1* | 1/2014 | Bocharov | B82Y 10/00 716/101 |
| 2014/0032457 | A1* | 1/2014 | Palmer | G06N 3/063 706/16 |
| 2016/0328253 | A1* | 11/2016 | Majumdar | G06N 3/126 |
| 2018/0018558 | A1* | 1/2018 | Lee | G06N 3/049 |
| 2018/0285736 | A1* | 10/2018 | Baum | G06F 30/27 |
| 2018/0293496 | A1* | 10/2018 | Vogels | G06V 10/454 |
| 2019/0050722 | A1* | 2/2019 | Gold | G06N 3/08 |
| 2019/0370071 | A1* | 12/2019 | Matveev | G06F 9/3877 |
| 2019/0385064 | A1* | 12/2019 | Malaya | G06N 3/084 |
| 2020/0082258 | A1* | 3/2020 | Gold | G06V 10/776 |
| 2021/0004344 | A1* | 1/2021 | Cohen | G06N 3/063 |
| 2021/0089862 | A1* | 3/2021 | Kim | G06N 3/04 |
| 2021/0089923 | A1* | 3/2021 | Kicanaoglu | G06N 3/045 |
| 2022/0172647 | A1* | 6/2022 | Peled | G06F 21/74 |

* cited by examiner

An individual gate is a triangular shape.

A sequence of gates gathered as closely as possible.

Circles of gates.

Concentric circles of gates.

COMPUTATION SYSTEM USING A SPHERICAL ARRANGEMENT OF GATES

CROSS-REFERENCE TO RELATED APPLICATIONS

The present application claims priority to the earlier filed provisional application having application No. 63/160,817 and hereby incorporates subject matter of the provisional application in its entirety. The present application also references the earlier filed provisional application by the present inventor having application No. 62/989,677 (also named "Computation System Using a Spherical Arrangement of Gates.") filed Mar. 14, 2020 and 62/813,443 (also named "Computation System Using a Spherical Arrangement of Gates.") filed Mar. 4, 2019 and incorporates subject matter of the provisional applications in entirety.

REGARDING FEDERALLY SPONSORED RESEARCH OR DEVELOPMENT

Not Applicable

BACKGROUND OF THE INVENTION

Physical implementation of logic gates is constrained by the materials that are used in the construction of the gates. Performing computation with materials like silicon and other crystals, faces the constraint of the size of inputs and outputs, and the size of the computation element while the physical arrangement of computation in biological cells, molecules, atoms is also so constrained. Gates are further constrained by the shape and quantity of their inputs and outputs.

Logic designs are often composed of two-input, one output designs. This type of design can implement several logic functions including NAND, NOR, AND, OR, XNOR, XOR, based on two inputs and one output. Implementation of logic gates in materials is constrained by the shape of the input-output structure. Implementation of types of logic gates which operate on an optical basis, or chemical, momentum, entropy or other method, may vary in their material constraints but the constraints posed by input and output node size remain. A triangular shape of the nor and nand gate is embodied by the connectivity of the inputs and output of the gates. Entropy transfer between three elements of the same size naturally forms a logic gate as shown in reference [1].

It can be posed that a fundamental constraint in the design of physical computation architectures is the quantity of inputs and outputs, and their structure. For a logic gate structure which has a quantity of inputs, and an output, let us consider that the inputs can be of equal physical size, and this size is to be the minimum possible size for the medium and structure in which the gate is embodied. The computation function that operates between input and output may be a comparatively smaller mass or volume between the inputs and outputs. The present invention assumes a greatly smaller area or volume requirement for the computation function as compared to the inputs and outputs.

Goal and Motivation of the Invention

It is a consequence of the physical requirements for the area of input and output structures that logic gates and computation structures take some common physical shapes when embodied. The function of a computation unit may have a size or volume requirement, but the input and output size or volume requirements may in some cases be larger than that of the computation unit. If the computation unit is greatly smaller than the inputs and outputs, then the shape of the structure is defined by the inputs and outputs, and takes on the shape shown in FIG. 1 for two dimensional designs. This is a triangular shape.

Packing computation into smaller volumes, when following a triangular computation unit yields circular forms in two dimensions and spheres in higher dimensions.

The motivation of this invention is to give a design which provides a high density of computation in regard to the physical space it occupies.

BRIEF SUMMARY OF THE INVENTION

A natural result of the different quantities of inputs and outputs in computational elements such as logic gates is a triangular shape when embedded in a material. The duplication of this shape while reducing empty space produces a curved structure, which taken to its ultimate expression is spherical. The inputs of the gates create a surface which is larger than the surface created by the outputs. In its spherical expression the input surface is the outside surface of the sphere, while the output is an inside surface of this sphere. Computation occurs as entropy transport from the outside surface, through layers, to an inside surface.

DETAILED DESCRIPTION OF THE INVENTION

Several logic functions including NAND, NOR, AND, OR, XNOR, XOR are characterized by multiple inputs and one output. Other types of computational functions such as those of neurons and artificial neurons also may take multiple inputs and fewer or singular outputs. Of these types of computation methods, the quantity of inputs is larger than the quantity of outputs.

The reverse of this asymmetry also can be found in the connections of neural networks, one example being a decoder artificial neural network, where inputs are fewer than outputs.

Let us consider a structure which embodies at least one input which has a physical size; a means to perform a computation function on input; and at least one output which has a physical size, that provides the result of the computation. Let us refer to this structure as a computation element eC.

Let us describe the computation element which has an unequal quantity of inputs and outputs as an asymmetrical computation element eCa. An asymmetrical computation element with more inputs than outputs is referred to as an iCa, while an asymmetrical computation element with more outputs than inputs is referred to as an oCa. An example iCa can be seen in FIG. 1.

Let the physical area requirement of an output be the same as that of the physical area of an input. For a design which features two inputs, the spatial area requirement of the inputs is approximately twice as large as the output. We can propose the following relationship for a two-input, one output gate: the input surface area is twice that of the output surface area.

One form of iCa is a logic gate, which has two inputs and one output. The inputs require more surface area than the output. We refer to this gate as G1 and its inputs as i1 and i2, and the output as o1. If we position i1 and i2 as closely as possible, they will require twice the surface area that o1 requires. If we position together the inputs of a gate in a physically proximal sequence G1$i$1, G1$i$2 for gate 1, input 1 and input 2 are physically as close as possible.

Figure 1:
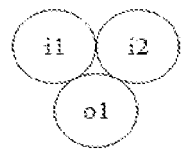
FIG. 1 shows an individual gate that is a triangular shape. The gate has inputs i1 and i2, and the output is o1. We can refer to this structure as G1, meaning gate 1. In the following drawings the gates are labeled in the form of G1, G2, G3 ( . . . ).
Figure 2:
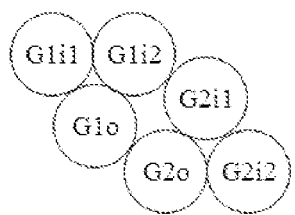
FIG. 2 A sequence of gates gathered as closely as possible in a plane. If we follow the location of the inputs (labeled G1i1, G1i2, G2i3, G2i4), we find that a curve is traced in a clockwise sweep to the right and downward. This curve is extended to a complete circle in FIG. 3. For three dimensional spherical structures, the curvature is extended to the additional dimension.

FIG. 1 shows this individual gate is a triangular shape. If we position together the inputs of several gates in a sequence G1$i$1, G1$i$2 G2$i$1, G2$i$2 G3G$i$1, G3$i$2 as shown in FIG. 2, the inputs for the three gates 1 2 and 3 are all physically as close as possible. The physical surface area required is 3 gates multiplied by 2 inputs: 6 surface area units. If we position together the outputs of these gates in a sequence G1$o$1 G2$o$2 G3$o$3 the outputs of the three gates 1 2 and 3 require (3 gates each having 1 output) a total of 3 surface area units. The input surface is larger than the output surface.

A sequence of gates gathered as closely as possible in space forms a shape which is longer on one side (the input side) than it is on the other (the output side). FIG. 2 shows a sequence of gates gathered as closely as possible. When we extend this sequence to its maximum extent, a circular form is present.

We use this layer in a multi-layer concentric ring design, and in the embodiment extend the rings to a higher dimension as spheres.

Figure 3:
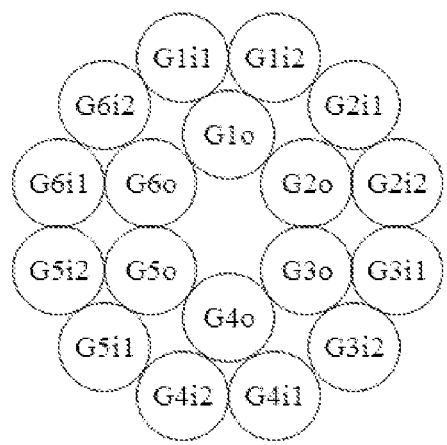
FIG. 3 shows the organization of logic gates which are necessarily of a triangular shape because of the size of their input and outputs, and that when the space is most efficiently consumed, they are arranged as circles of gates.
Figure 4:
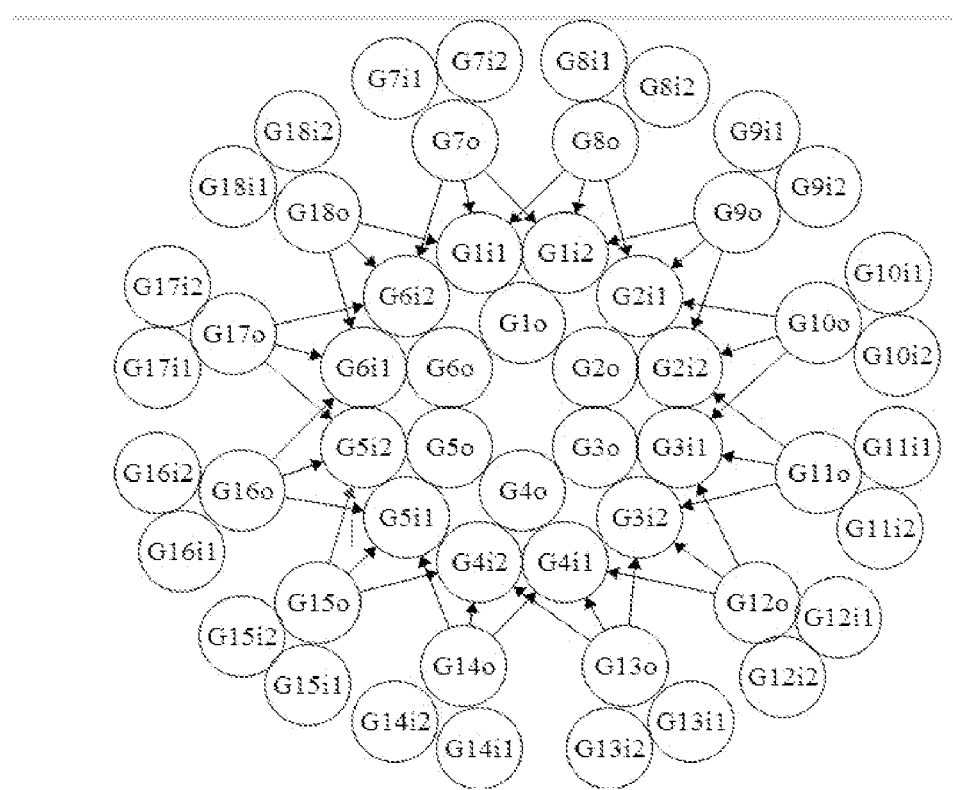
FIG. 4 shows the organization of concentric circles of gates, in which inputs and outputs consume the maximum area possible. This figure is in two dimensions but can be extended to three dimensions with the same general triangular structure of gates. For three dimensional, spherical structures, the area available on a layer of the sphere is greater than the two dimensional design, allowing a greater quantity of inputs and outputs out the outmost surface of the layer.

FIGS. 3 and 4 show concentric circles of gates. Concentric circles of gates can be arranged, with the output of gates on the outer circles being near the input of gates on the inner circles. By linking the output of a gate to the inputs of other gates, logic can be performed by chains of gates. If the gates are neurons or artificial neurons then computation can be performed as controlled by the weights of the connections and the neuron's activation function.

Example Implementation, a Preferred Embodiment

Computation elements as described in the "DETAILED DESCRIPTION of the INVENTION" are referred to as eCa. The choice of composition of spherical layers of eCa being either the iCa (greater quantity of inputs than outputs) or oCa (greater quantity of outputs than inputs) configuration is determined by the intended function of the device, as concentric spherical layers of iCa reduce entropy, while concentric spherical layers of oCa increase entropy from input to output. Concentric iCa layers are useful for encoders, while concentric oCa layers are useful for decoders.

We can implement an encoder architecture, which reduces the entropy at the inputs to a finite symbol set at the outputs. Computation elements as described in the "DETAILED DESCRIPTION of the INVENTION" of type iCa are grouped into curved spherical surfaces of layers which have information inputs on the outside, and information outputs on the inside. iCa type elements have a larger quantity of inputs than outputs and so the inputs require the larger surface area of the outside of the spherical layer. Layers are added spherically, connecting the output of one layer to the input of the next. Information presented at the outer surface of the sphere is processed from the outer surface inputs passing to interior layers of computation elements (FIG. 3 and FIG. 4).

At each layer the inputs are oriented to be at the position on the layer closer to the surface of the sphere, and the outputs are closer to the center of the sphere. The area available for inputs is larger than that available for outputs. At each layer the input information passes through a computation element which reduces it to fewer outputs which reach the next interior layer. At the center of the sphere, an entropy reduced set of information is computed by passing data received at the inputs on the surface of the sphere, through the concentric spherical layers which each have fewer outputs than the preceding layer.

REFERENCES

1] Forrest Fabian Jesse, Zhenjiang Miao, Weidong Li. Entropy NOR: Early Functional Completeness In Entropy Networks. Fluctuation and Noise Letters. 2016. 15(1): p. 1650004. DOI: 10.1142/S0219477516500048

2] Forrest Fabian Jesse. Entropy NAND: Early Functional Completeness in Entropy Networks. 2014. arXiv preprint arXiv:1410.2670

The invention claimed is:

1. A device consisting essentially of
computation elements eCa which perform a computation on one or more inputs and produce one or more outputs;
the computational elements have unequal quantities of inputs and outputs;
computation elements have input and output nodes which connect computation elements together by connecting inputs and outputs;
computational elements eCa are grouped into curved spherical surfaces of layers
having a larger quantity of inputs or outputs on the larger outer surface of the spherical layer,
while allocating the smaller quantity of inputs or outputs to the smaller inner surface of the spherical layer;
a two dimensional implementation being a cross-section of the sphere.

* * * * *